United States Patent
Ong et al.

(10) Patent No.: US 7,589,966 B2
(45) Date of Patent: Sep. 15, 2009

(54) LOW-COST, SELF-ALIGNING, BLIND MATING, TOOL-LESS FAN MODULE

(75) Inventors: Brett C. Ong, San Jose, CA (US); Russell K. Brovald, Santa Clara, CA (US); Jay Cisneroz, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 68 days.

(21) Appl. No.: 11/947,048

(22) Filed: Nov. 29, 2007

(65) Prior Publication Data

US 2009/0141448 A1    Jun. 4, 2009

(51) Int. Cl.
*H05K 7/20* (2006.01)
(52) U.S. Cl. .................. 361/695; 361/690; 415/213.1
(58) Field of Classification Search ........................ None
See application file for complete search history.

(56) References Cited

U.S. PATENT DOCUMENTS

| | | | |
|---|---|---|---|
| 6,244,953 B1 * | 6/2001 | Dugan et al. ................. 454/184 |
| 6,722,971 B2 * | 4/2004 | Gough ........................ 454/187 |
| 6,817,889 B2 * | 11/2004 | Chang et al. ................. 439/485 |
| 7,118,334 B2 * | 10/2006 | Winkler et al. ............ 415/213.1 |
| 7,186,075 B2 * | 3/2007 | Winkler et al. .............. 415/119 |
| 7,230,826 B2 * | 6/2007 | Kyle et al. ................... 361/695 |
| 7,306,425 B2 * | 12/2007 | Park et al. .................... 415/119 |
| 7,312,991 B2 * | 12/2007 | Lee et al. ..................... 361/695 |
| 7,495,910 B2 * | 2/2009 | Yang .......................... 361/695 |
| 7,500,827 B2 * | 3/2009 | Mizuguchi ............... 415/213.1 |
| 2008/0239665 A1 * | 10/2008 | Franz et al. .................. 361/695 |

* cited by examiner

*Primary Examiner*—Boris L Chervinsky
(74) *Attorney, Agent, or Firm*—Osha • Liang LLP

(57) ABSTRACT

A fan module, including a housing for receiving a fan, a connector configured to mate with a connector housing, and a vibration pad configured to isolate vibrations of the fan from transferring through the fan module, wherein the fan module is configured to receive an alignment attachment standoff.

18 Claims, 4 Drawing Sheets

LOW-COST, SELF-ALIGNING, BLIND MATING, TOOL-LESS FAN MODULE

BACKGROUND

Over time, as the performance of rack mounted computer systems has increased, the amount of heat generated by various computer system components has increased. This, in turn, requires enhanced cooling to maintain required operating temperatures. The most common approach to computer system cooling is the use of fans. However, with the ever-increasing power budget and space constraints of rack mounted computer systems, available cooling solutions are limited. Because space constraints restrict the physical size of fans, a common solution is the use of fans with high revolutions per minute (RPM). However, high RPM fans significantly increase the amount of vibration generated throughout the computer system. Conventionally, computer servers are thin, and there is very little tolerance between the individual hardware racks within the computer system.

The design of fan modules are becoming increasingly complex and ever-increasing requirements are being imposed on the design. Fan modules need to be easily replaced FRUs (Field-Replaceable Units), and have tool-less installation and removal. Installation also needs to be fool-proof, to prevent incorrect installation of fan modules. In addition, fan modules require mechanical isolation to prevent transmission of mechanical vibration to sensitive Hard Disk Drive (HDD) modules.

FIG. 1 shows a conventional example of fan module. In FIG. 1, the fan module (100) is fixed within a bracket (102). The bracket (102) is a tool-less fan attachment into which the fan module (100) is placed so that the vibration caused by the fan (within the fan module (100)) rotating at high speeds is isolated within the bracket (102). The bracket (102) is typically placed within the chassis of the computer system, as can be seen in FIG. 1.

SUMMARY

In general, in one aspect, the invention relates to a fan module, comprising a housing for receiving a fan, a connector configured to mate with a connector housing, and a vibration pad configured to isolate vibrations of the fan from transferring through the fan module, wherein the fan module is configured to receive an alignment attachment standoff.

Other aspects of the invention will be apparent from the following description and the appended claims.

DETAILED DESCRIPTION

Figure 1:
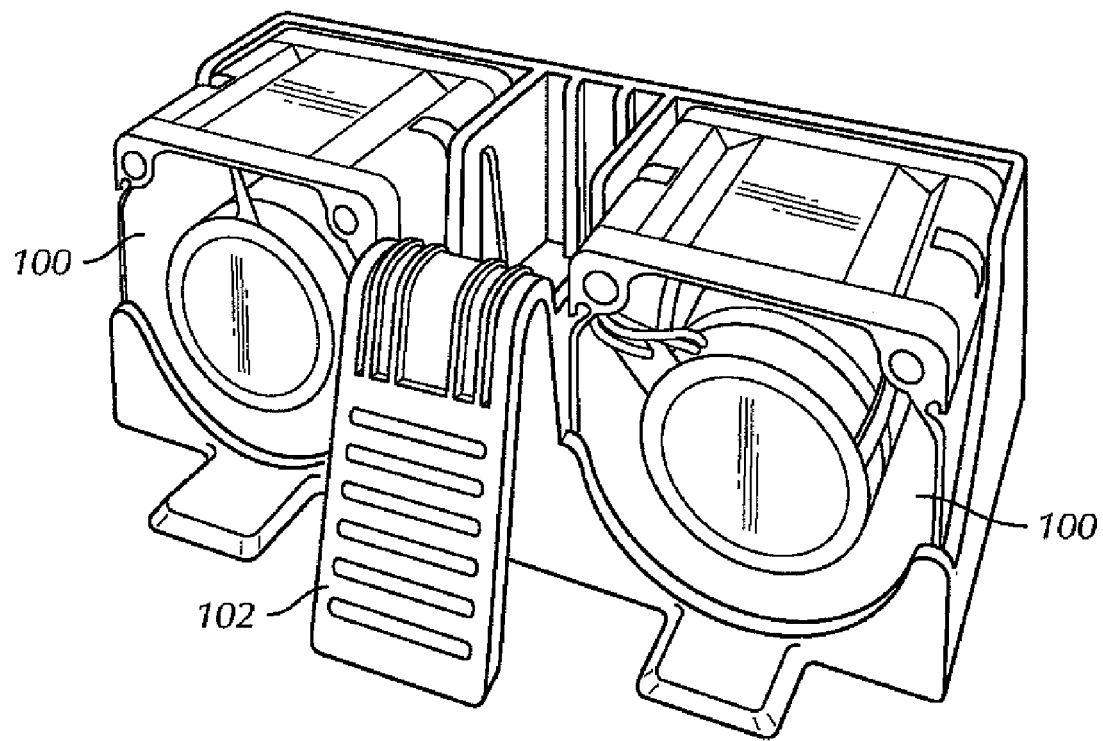
FIG. 1 shows a conventional fan bracket.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention relate to an improved fan module with tool-less placement, which can be used even in restricted spaces within computer systems. Particularly, embodiments of the invention provide a self-aligning, fool-proof fan module that can be easily installed in any area of a computer system.

Figure 2:
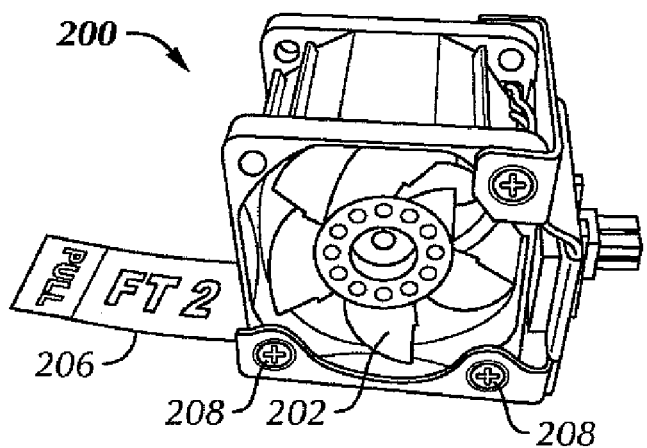
FIGS. 2-4 show fan modules in accordance with one or more embodiments of the invention.

FIG. 2 shows a fan module (200) in accordance with one or more embodiments of the invention. The fan module (200) is a tool-less field replacement unit (FRU). A fan (202) is placed inside the fan module (200). In other words, the fan module (200) is a housing that receives a fan (202). More specifically, in one or more embodiments of the invention, the walls of the fan module (200) are connectable to the fan (202). In one or more embodiments of the invention, the fan module (200) may be made out of sheet metal material. Sheet metal requires a small wall section to implement, and simple screws (208) can be used to attach the various parts of the fan module (200) to the fan (202). Those skilled in the art will appreciate that the fan module may also be made out of alternate materials, such as plastic, rubber, or any other suitable material. Further, those skilled in the art will appreciate that any type of connector may be used instead of screws to attach the fan module to the fan.

In one or more embodiments of the invention, the fan (202) may snap into the fan module (200) without any need for fixing or attaching the fan (202) into the fan module (200). Thus, the fan module (200) provides fool-proof assembly of the fan (202) into the fan module (200). In addition, as can be seen in FIG. 2, the fan module (200) includes a fan extraction tab (206). The fan extraction tab (206) provides a visual indication of the presence of the fan module (200), as the fan module (200) may be hidden from plain view when placed in a corner, underneath another component, or in a limited space area within the computer system. In addition, the fan extraction tab (206) allows for removal of the fan module (200) by pulling on the fan extraction tab (206). The fan extraction tab (206) may be made out of any material, such as plastic, rubber, laminate, foam, metal, wood, or any other suitable material. In one or more embodiments of the invention, a label may be printed onto the fan extraction tab (206) to identify the type of fan (202) contained within the fan module (200). The label may be printed in color for easy detection of the fan module (202).

Those skilled in the art will appreciate that although the fan extraction tab is shown in FIG. 2 as an elongate rectangular component, any type of extraction mechanism may be attached to the fan module to allow for easy removal of the fan module. For example, a circular ring, a handle of any shape, or a type of label may be used as a fan extraction tab. If a wooden or other material handle is used, then text identifying the type of fan contained in the fan module may be molded or carved into the handle.

Figure 3:
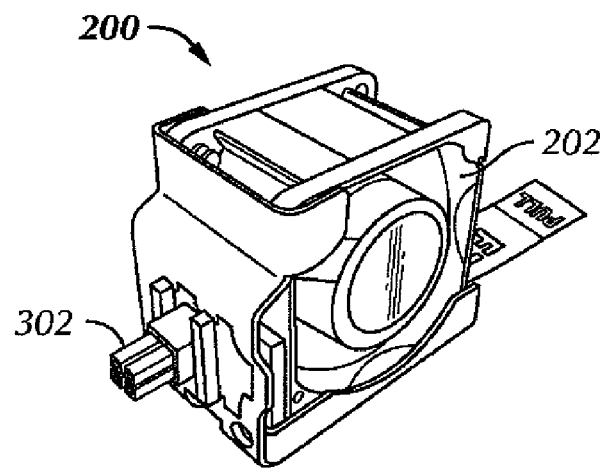

FIG. 3 shows an alternate view of the fan module (200) in accordance with one or more embodiments of the invention. The view in FIG. 3 focuses on a connector (302) that is part of the fan module (200). In one or more embodiments of the invention, the connector (302) is a self-aligning connector that allows for fool-proof installation of the fan in a server rack. The connector may be any type of connector that mates with a corresponding connector housing (not shown). Thus, in one or more embodiments of the invention, the connector (302) may serve as a retention snap that holds the fan module (200) in place such that the fan module (200) cannot be removed from its installed location without the release of the retention snap (i.e., the connector (302)). However, because not all computer chassis, server racks, or systems are made to be the same, the connector (302) may also be a floating connector that provides some tolerance and room for movement within the connector housing of the computer chassis. As a result, the floating feature of the connector (302) also serves to reduce the transmission of vibration caused by the fan (202) to other components of the system. Thus, in one or more embodiments of the invention, a retention snap of the fan module (200) also serves as a vibration damping device.

Figure 4:
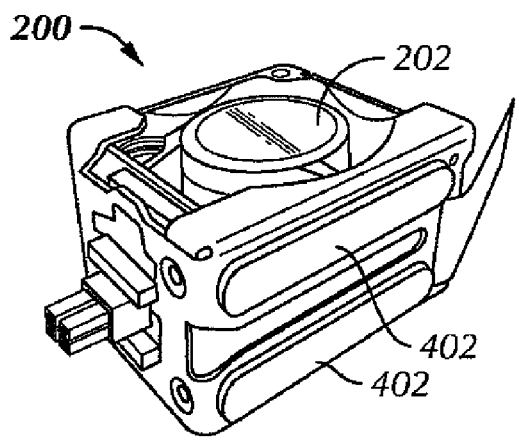

FIG. 4 is a view of the fan module (200) in accordance with one or more embodiments of the invention. More specifically, FIG. 4 shows vibration isolation pads (402) included on a side of the fan module (200). The vibration isolation pads (402) serve to isolate the vibration caused by the high-speed rotation of the fan (202) within the fan module (200) and prevent the transmission of vibration to near-by hardware components, such as hard disk drives, etc. That is, the vibration isolation pads (402) dampen the fan vibration. In addition, the vibration isolation pads (402) provide the force necessary to retain the fan module (200) in place. In one or more embodiments of the invention, the vibration isolation pads may be on the same wall of the fan module as the alignment feature that aligns with the fan attachment standoffs (discussed below in FIG. 5). The vibration pads may be made from rubber, foam, elastomer, plastic, or any other vibration-absorbing material.

In one or more embodiments of the invention, because the fan module is fitted within a restricted space in a computer system, the vibration isolation pads may be squeezed into place when installation of the fan module (200) takes place. That is, the vibration pads are initially undeformed on the fan module, but become deformed when the fan module is installed into a computer chassis or other restricted space. Thus, the vibration isolation pads (402) provide a tolerance of the available height of the isolated space in which the fan module (200) is fitted. In other words, the height of the space into which the fan is installed may be less than a combined height of the fan module and the vibration isolation pad(s). Those skilled in the art will appreciate that although FIG. 4 shows two separate vibration pads, the fan module may include any suitable number of vibration pads on one or more walls of the fan module.

Figure 5:
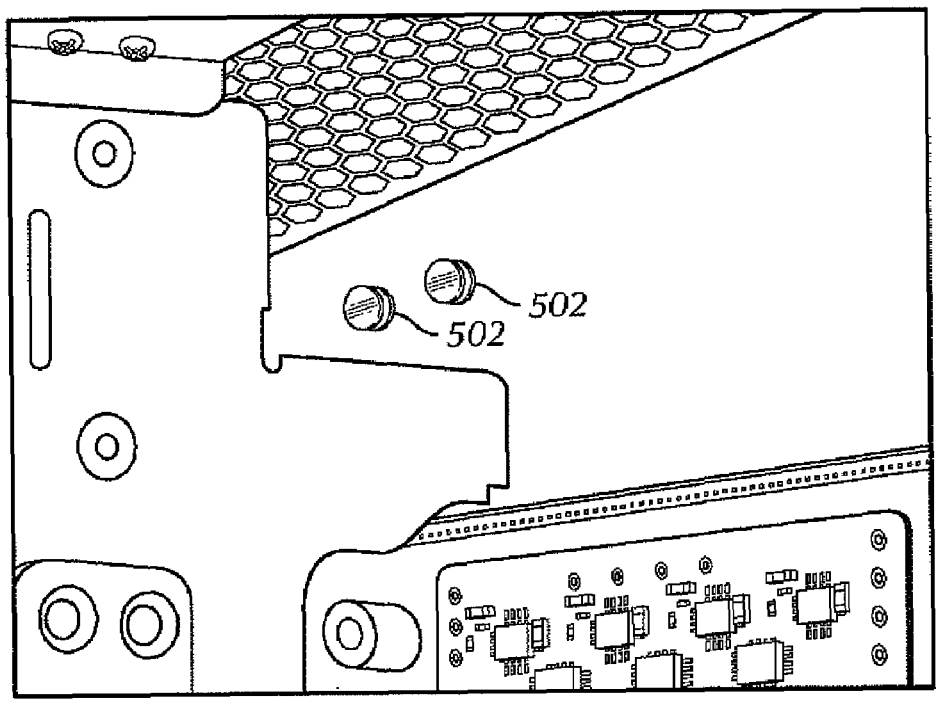
FIGS. 5-6 show placement of fan modules in accordance with one or more embodiments of the invention.

FIG. 5 shows an example of a placement of the fan module in accordance with one or more embodiments of the invention. In particular, FIG. 5 shows fan attachment standoffs (502) (also called alignment attachment standoffs) under which the sheet metal (or other suitable material) of the fan module slide. That is, in one or more embodiments of the invention, the fan attachment standoffs (502) are located on the chassis within which the fan module (200) is placed, and the bottom-side of the fan module (200) includes an alignment feature that aligns using the fan attachment standoffs (502) on the chassis. For example, the alignment feature may include a channel, a track, a slot, or other appropriate mechanism for receiving and/or fitting with the fan attachment standoffs. In one or more embodiments of the invention, two fan attachment standoffs (502) are shown for alignment purposes. Thus, the fan attachment standoffs (502), together with the connector of FIG. 3 (302), provide for blind-mating of the fan module (200) into a location within the chassis of a computer system. Those skilled in the art will appreciate that the fan attachment standoffs may be any size or shape, and the computer chassis may include any number of fan attachment standoffs. For example, the fan attachment standoffs may form a T-shaped alignment on the bottom of the fan module. Alternatively, the fan attachment standoffs may form a rectangular alignment, a circular alignment, or any other suitable shaped alignment for blind mating of the fan module into the computer chassis.

Figure 6:
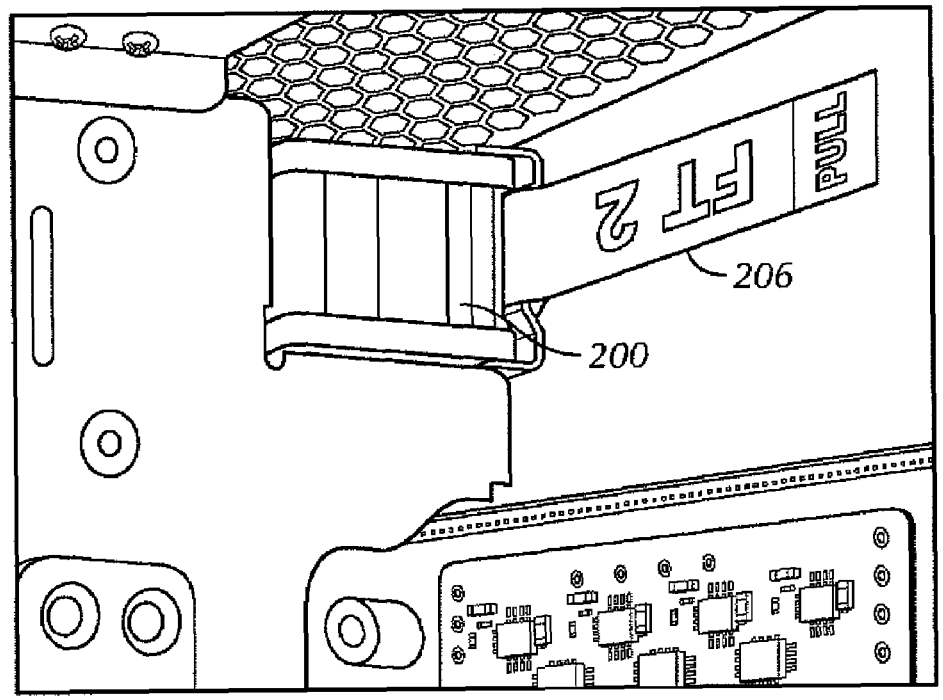

FIG. 6 shows a placement of the fan module within an isolated corner of a computer system in accordance with one or more embodiments of the invention. As can be seen in FIG. 6, the fan module (200) is completely hidden from view and only the fan extraction tab (206) is visible to a person viewing the computer chassis or computer system in which the fan is installed. Embodiments of the invention relate to assembling and installing a fan in such a restricted space, such as an isolated corner as shown in FIG. 6. Those skilled in the art will appreciate that although embodiments of the invention are suited for installation of a fan in a particularly space-constrained area, embodiments of the invention may apply equally to the installation of fans in an area that is not space-constrained.

Figure 7:
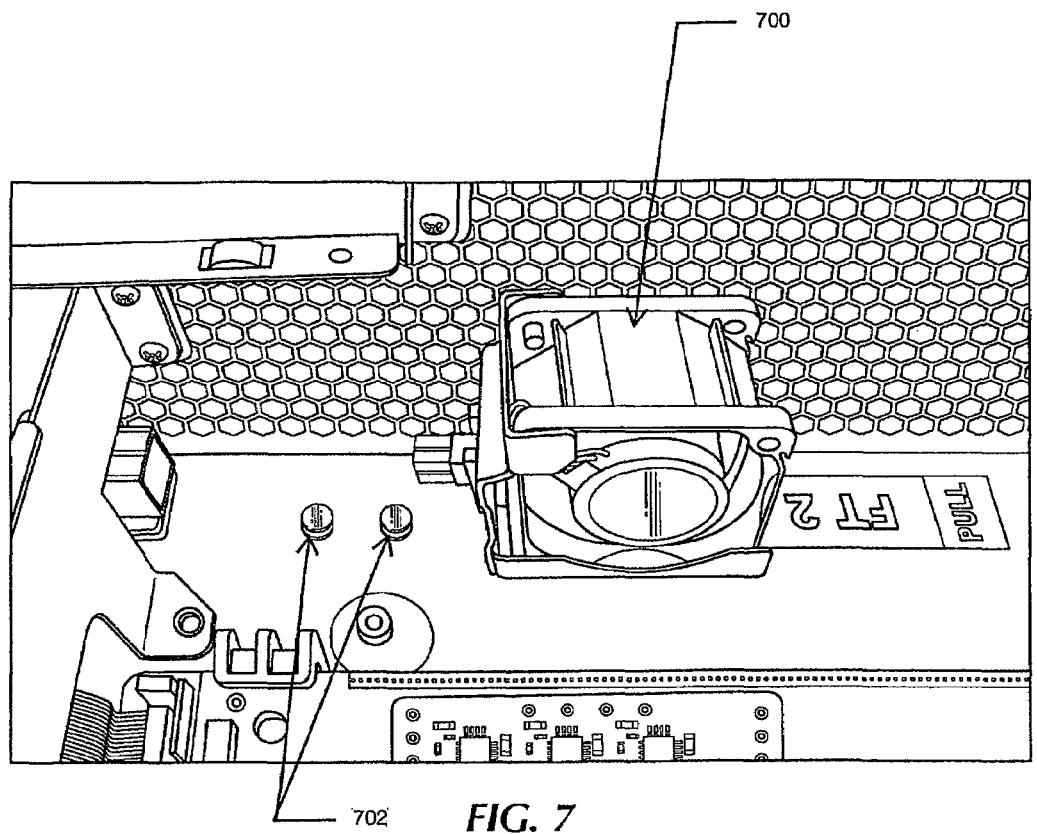
FIGS. 7-8 show a process of installation of fan modules in accordance with one or more embodiments of the invention
Figure 8:
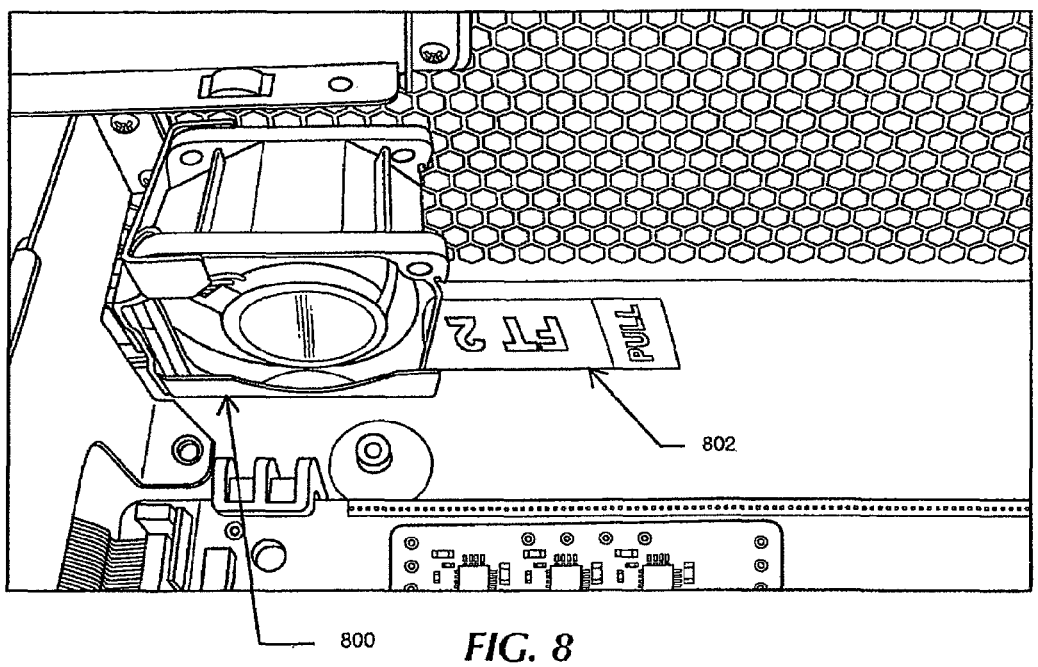

FIGS. 7 and 8 show a process for installing a fan module in accordance with one or more embodiments of the invention. More specifically, FIGS. 7 and 8 show an internal view of installing the fan module into a computer chassis in accordance with embodiments of the invention. In FIG. 7, the fan module (700) is slid along the fan attachment standoffs (702) into the isolated corner, as shown. More specifically, the face of the fan module (700) that includes the protruding floating connector is slid into the connector housing within the isolated corner of the computer chassis. As described above, due to the design of the fan module, the fan module is self-aligning and blind-mating and therefore, installation of the fan into the isolated corner is fool-proof Because the sheet metal aligns with the fan attachment standoffs (702), and the connector is fitted into the connector housing, the fan module (700) cannot be installed incorrectly.

FIG. 8 shows the finals step of the installation process, where the fan module (800) is installed into the corner of the computer chassis, and the fan extraction tab (802) remains in a visible area of the computer system. In FIG. 8, the floating connector of the fan module (800) has snapped into place within the connector housing, and the fan module (800) is aligned according to the connector and the fan attachment standoffs. Those skilled in the art will appreciate that, particularly in the case of 1U servers, the fan module may be located in a very restricted space.

Embodiments of the invention provide a simple design for a tool-less, low-cost, self-aligning and blind-mating fan module. The fan module of the present invention is a self-aligning, blind mating mounting mechanism with mechanical isolation of minimal vibration transmission through the computer system. In addition, the vibration damping mechanism functions as a retention snap for the fan module, simplifying the design and reducing the part and assembly cost of the fan module. Particularly, the fan module of the invention optimizes the use of space, and can be used in hidden or awkward positions within a computer chassis or server rack. The ergonomic release snap of the fan module allows for easy removal of the fan module from the restricted area in which the module is fitted. The one-part design is able to provide a significant list of features, including fool-proof installation and assembly and easy removal. Further, embodiments of the present invention are scalable to any size fans.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A fan module, comprising:
a housing for receiving a fan;
a connector configured to mate with a connector housing,
a vibration pad configured to isolate vibrations of the fan from transferring through the fan module, and
a fan extraction tab configured to facilitate removal of the fan module,
wherein the fan module is configured to receive an alignment attachment standoff.

2. The fan module of claim 1, wherein the fan module is made of one selected from a group consisting of sheet metal, rubber, and plastic.

3. The fan module of claim 1, wherein the connector is a self-aligning, floating connector configured to dampen the vibrations of the fan.

4. The fan module of claim 1, wherein a height of a space into which the fan is installed is less than a combined height of the fan module and an undeformed vibration pad.

5. The fan module of claim 1, wherein the fan module is a self-aligning, blind-mating fan module.

6. The fan module of claim 1, wherein the connector functions as a retention snap for the fan module.

7. The fan module of claim 1, wherein the fan extraction tab is further configured to identify a type of fan housed by the fan module.

8. The fan module of claim 1, wherein the fan extraction tab is made from one selected from a group consisting of plastic, metal, wood, rubber, laminate, and foam.

9. The fan module of claim 1, wherein the fan extraction tab is one selected from a group consisting of a ring, a handle, and an elongated tab.

10. The fan module of claim 1, wherein the vibration pad is made using one selected from a group consisting of rubber, elastomer, foam, and plastic.

11. The fan module of claim 1, wherein the fan module comprises at least two vibration pads.

12. The fan module of claim 1, wherein the fan module is configured to be installed in a computer chassis.

13. The fan module of claim 12, wherein the alignment attachment standoff is located on a wall of the computer chassis.

14. The fan module of claim 1, wherein the fan module is configured to receive at least two alignment attachment standoffs.

15. The fan module of claim 1, wherein the fan is retained in the housing of the fan module using at least one screw.

16. The fan module of claim 1, wherein the housing snaps onto the fan.

17. The fan module of claim 1, wherein the alignment attachment standoff is round.

18. The fan module of claim 1, wherein the housing comprises one selected from a group consisting of a channel, a track, and a slot for receiving the alignment attachment standoff.

* * * * *